United States Patent
Goller et al.

(10) Patent No.: US 8,273,658 B2
(45) Date of Patent: Sep. 25, 2012

(54) INTEGRATED CIRCUIT ARRANGEMENT INCLUDING VIAS HAVING TWO SECTIONS, AND METHOD FOR PRODUCING THE SAME

(75) Inventors: Klaus Goller, Regensburg (DE); Jakob Kriz, Weinboehla (DE)

(73) Assignee: Infineon Technologies AG, Neubiberg (DE)

( * ) Notice: Subject to any disclaimer, the term of this patent is extended or adjusted under 35 U.S.C. 154(b) by 411 days.

(21) Appl. No.: 11/575,385

(22) PCT Filed: Aug. 25, 2005

(86) PCT No.: PCT/EP2005/054184
§ 371 (c)(1),
(2), (4) Date: Aug. 26, 2008

(87) PCT Pub. No.: WO2006/029957
PCT Pub. Date: Mar. 23, 2006

(65) Prior Publication Data
US 2008/0303169 A1    Dec. 11, 2008

(30) Foreign Application Priority Data
Sep. 15, 2004 (DE) .......... 10 2004 044 686

(51) Int. Cl.
*H01L 21/44* (2006.01)

(52) U.S. Cl. ........ 438/672; 438/622; 438/637; 438/638; 438/639; 438/640; 438/675; 438/685

(58) Field of Classification Search .......... 438/622, 438/637, 638–640, 672, 675, 685–688
See application file for complete search history.

(56) References Cited

U.S. PATENT DOCUMENTS

| | | | |
|---|---|---|---|
| 4,560,436 A | | 12/1985 | Bukhman et al. |
| 5,933,756 A | | 8/1999 | Fuse |
| 6,358,830 B1 | | 3/2002 | Morozumi |
| 6,683,002 B1 | * | 1/2004 | Chooi et al. .......... 438/687 |
| 6,716,746 B1 | * | 4/2004 | Kim et al. .......... 438/637 |
| 6,893,957 B2 | * | 5/2005 | Trivedi et al. .......... 438/632 |
| 2005/0059232 A1 | * | 3/2005 | Andreas .......... 438/627 |

FOREIGN PATENT DOCUMENTS

| | | |
|---|---|---|
| DE | 102 44 570 | 4/2003 |
| EP | 0 380 327 | 8/1990 |
| JP | 63276246 | 11/1988 |
| JP | 09082664 | 3/1997 |
| JP | 2001244334 | 9/2001 |

OTHER PUBLICATIONS

Stanley Wolf, Richard N. Tauber, "Silicon Processing for the VLSI Era, vol. I: Process Technology", 1986, Lattice Press, p. 406.*

* cited by examiner

*Primary Examiner* — Jae Lee
(74) *Attorney, Agent, or Firm* — Dicke, Billig & Czaja, PLLC

(57) ABSTRACT

An integrated circuit arrangement containing a via is disclosed. The via has an upper section having greatly inclined sidewalls. A lower section of the via has approximately vertical sidewalls. In one embodiment, a liner layer is used as a hard mask in the production of the via and defines the position of the sections of the via.

14 Claims, 2 Drawing Sheets

US 8,273,658 B2

INTEGRATED CIRCUIT ARRANGEMENT INCLUDING VIAS HAVING TWO SECTIONS, AND METHOD FOR PRODUCING THE SAME

CROSS REFERENCE TO RELATED APPLICATION

This Utility Patent Application claims the benefit of the filing date of German Application No. DE 10 2004 044 686.5, filed Sep. 15, 2004, and International Application No. PCT/EP2005/054184, filed Aug. 25, 2005, both of which are herein incorporated by reference.

BACKGROUND

The invention relates to an integrated circuit arrangement containing a component level in which a multiplicity of electronic components are arranged.

By way of example, active electronic components are arranged in a semiconductor substrate. As an alternative, the active components are arranged, for example, on an SOI substrate (silicon on insulator).

An integrated circuit arrangement additionally contains a first conductive structure near to the component level. Said conductive structure is for example part of an interconnect level in which many interconnects are arranged. If the interconnects are produced by a damascene method, then the interconnects of an interconnect level lie between the planar polishing areas of successive polishing processes. However, interconnect levels produced according to other production methods are also used.

The integrated circuit arrangement contains a second conductive structure arranged further away from the component level than the first conductive structure. The second conductive structure, too, is usually part of an interconnect level in which are arranged a multiplicity of interconnects that have been produced simultaneously.

The integrated circuit arrangement also contains a vertical conductive structure, one end of which is arranged at the first conductive structure and the other end of which is arranged at the second conductive structure. The vertical conductive structures are referred to as contact if the first conductive structure is arranged in a semiconductor substrate or includes polycrystalline silicon. If, by contrast, the first conductive structure includes a metal, then the vertical conductive structure is referred to as a via.

The vertical conductive structure contains a first section near to the first conductive structure and a second section near to the second conductive structure, the specification with regard to distance being made in relation to the respective other section. The first section of the vertical conductive structure therefore lies nearer to the first conductive structure than the second section of the vertical conductive structure.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
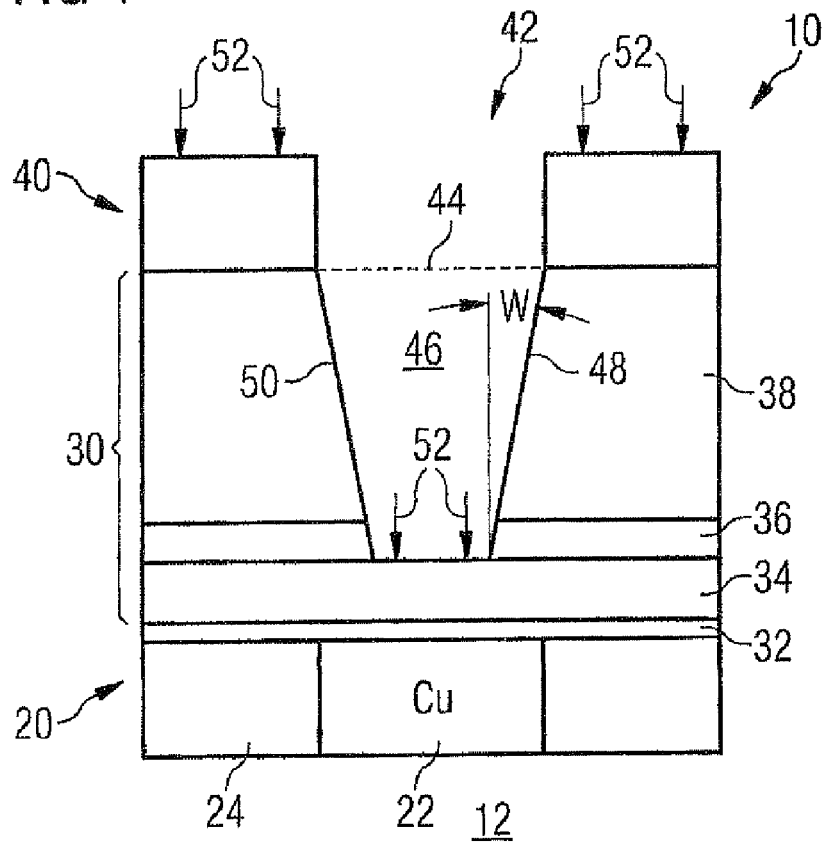
FIGS. 1 to 4 illustrate an integrated circuit arrangement and production stages in the production of an integrated circuit arrangement.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments of the invention provide an integrated circuit arrangement which is constructed in a simple manner and which can be produced in particular in a simple and reliable manner. Moreover, the intention is to specify a production method.

The invention is based on the consideration that on account of the decreasing minimum feature size, measures have to be taken which enable the vertical conductive structure to be reliably filled. In the case of the invention, this measure consists in the fact that the second section tapers as the distance from the component level decreases and that the first section of the vertical conductive structure does not taper, or tapers to a lesser extent than the second section of the vertical conductive structure as the distance from the component level decreases. It is thereby possible to take account of a small minimum feature size at the bottom of the vertical conductive structure. In the upper part of the vertical conductive structure, by contrast, the vertical conductive structure is widened, thereby facilitating filling, for example with a metal. In the case of a vertical conductive structure formed in this way, the conductive structure can be filled with the aid of two metal depositions, only the first metal deposition having a comparatively high deposition temperature. The second deposition can be carried out at considerably lower deposition temperatures than the first deposition temperature. The temperature budget required for filling the vertical conductive structure decreases as a result of this measure. Moreover, a metal deposition at comparatively moderate temperatures affords the advantage that the grain size of the grains that form is comparatively small, with the result that structure edges are imaged conformally. This makes it possible, for example, to readily identify alignment marks.

In one embodiment of the invention, there is an intermediate region, e.g., an edge, between the first section of the vertical conductive structure and the second section of the vertical conductive structure. The region lies at the boundary between the first section and the second section of the vertical conductive structure. A dielectric layer is situated at the region, said dielectric layer being referred to hereinafter as hard mask layer. The hard mask layer has a different material composition than a dielectric layer enclosing the second section of the vertical conductive structure. The hard mask layer permits precise definition of the position or length of the first section and of the second section in the vertical direction. The integrated circuit arrangement can thus satisfy narrow specifications, for example with regard to the propagation time for the signal transmission in the conductive structures. Moreover, the hard mask layer makes it possible to produce the vertical conductive structure according to the invention by only one lithography process. The two sections are formed in mutually different ways through the use of at least two different etching processes, in particular with regard to the angle of inclination of the sidewalls.

In another embodiment, the hard mask layer has a different material composition than a dielectric layer arranged at a location of the vertical conductive structure which is at the same distance from the region as from a side of the first conductive structure that is remote from the component level. This enables the hard mask layer to be made thin in comparison with the depth of the vertical conductive structure. After the perforation of the hard mask layer, it is possible to produce a cutout for the first section of the vertical conductive structure in a simple manner.

In another embodiment, the upper, second section is longer than the lower, first section as seen in a vertical direction, with the result that the lower section can be readily filled by a "hot" deposition process and the upper section, on account of its long inclined sidewalls, can be readily filled by a "cold" deposition process.

In another embodiment, the vertical conductive structure has no further sections apart from the first section and the second section. This means that the vertical conductive structure, despite its subdivision into two sections, is constructed in a simple manner and is simple to produce.

In another embodiment, the contour profile of all cross sections through the vertical conductive structure in planes which lie parallel to the component level is identical, apart from the size of the contours. By way of example, the contours run along circles or squares. The contours in one configuration are identical in the first section. In the second section, by contrast, for example the radius of the circles or the side length of the squares increases as the distance from the component level increases, see e.g., FIG. 1, reference symbol 12. The contour profiles that are identical apart from the size can be attributed to the use of only one lithography method for producing the vertical conductive structure.

In another embodiment of the circuit arrangement according to the invention, the first conductive structure has been produced by using a different lithographic method than the vertical conductive structure. Therefore, the contour profiles of both conductive structures also differ, to be precise not only with regard to the size. The second conductive structure has also been produced by using a different lithographic method than the vertical conductive structure, with the result that, here too, the contours differ not only with regard to the size.

In another embodiment, the first conductive structure contains at least 80 atomic percent of copper. Copper affords a high current-carrying capacity even in the case of small minimum feature dimensions. By contrast, the vertical conductive structure and the second conductive structure contain at least 80 atomic percent of aluminum. Aluminum affords the advantage that it is readily bondable and is therefore very well suited to the topmost metallization level, in particular.

In another embodiment of the method according to the invention, the first conductive structure and the second conductive structure are interconnects serving for lateral current transport. By contrast, the vertical conductive structure is a via serving essentially for vertical current transport.

The invention relates to a method for producing an integrated circuit arrangement, in particular the circuit arrangement according to the invention or one of its developments. The abovementioned technical effects therefore apply to the method as well.

FIGS. 1 to 4 illustrate cross sections through the longitudinal axis of a via which is to be produced in an integrated circuit arrangement 10. As illustrated in FIG. 1, a component level 12 has already been fabricated, in which are arranged a multiplicity of active electronic semiconductor components, for example bipolar transistors, field effect transistors and/or diodes. By way of example, monocrystalline silicon is used as semiconductor material. The cross-sectional plane of the cross sections illustrated in FIGS. 1 to 4 lies at an angle of 90 degrees with respect to the component level 12.

In one embodiment, a plurality of levels (not illustrated) of the integrated circuit arrangement 10, for example patterned levels composed of polycrystalline silicon or further metallization levels, are arranged between the component level 12 and an interconnect level 20. In an another exemplary embodiment, the interconnect level 20 is the first metallization level.

The interconnect level 20 contains a multiplicity of interconnects, one interconnect 22 of which is illustrated in FIG. 1. The interconnects of the interconnect level 20 lie in one plane and include copper which is embedded in a jacket or liner layer, for example in a titanium nitride layer or a tantalum nitride layer. Arranged between the interconnects 22 of the interconnect level 20 is a dielectric 24, for example silicon dioxide or a dielectric having a relative permittivity of less than 3.9. The interconnect level 20 is produced for example by a dual or single damascene method.

A via level 30 is produced in a manner adjoining the interconnect level 20, the following layers being deposited in the following order:

a barrier layer 32 having a layer thickness within the range of 50 nm to 100 nm, in the exemplary embodiment having a layer thickness of 50 nm; the barrier layer 32 includes an electrically nonconductive material which is a diffusion barrier for copper atoms, e.g., silicon nitride.

A dielectric having a layer thickness within the range of 150 nm to 250 nm, for example, in the exemplary embodiment layer of 200 nm. The dielectric layer 34 includes for example silicon dioxide or a material having a relative permittivity of less 3.9.

A hard mask layer 36 composed of an electrically insulating material having a layer thickness, for example, within the range of 50 nm to 150 nm. In the exemplary embodiment, the layer thickness of the hard mask layer 36 is 100 nm. By way of example, the hard mask layer 36 includes silicon nitride. As an alternative, the hard mask layer 36 includes silicon carbide or some other nonconductive material.

A dielectric layer 38 having a layer thickness within the range of 150 nm to 1000 nm. In the exemplary embodiment, the layer thickness of the dielectric layer 38 is e.g., 500 nm. By way of example, the dielectric layer 38 includes silicon dioxide or a material having a relative permittivity of less than 3.9.

The dielectric layer 34 is deposited such that it is as thin as possible. However, the thickness of the dielectric layer 34 should be greater than the thickness of the hard mask layer 36, with the result that the dielectric layer 34 can readily be patterned with the aid of the hard mask layer 36.

A resist layer 40 is applied to this layer stack, and is patterned with the aid of a photolithographic method. A cutout 42, under which the via is to be produced, arises during the development of the resist layer 40. The via to be produced is part of the via level 30 in which a multiplicity of vias that are all constructed identically are situated.

As is further illustrated in FIG. 1, with the aid of an etching process 52 a cutout 46 is produced in the dielectric layer 38, said cutout having inclined sidewalls 48, 50. The inclination of the sidewalls 48, 50 relative for example to the direction of the normal to the hard mask layer 36 lies e.g., within the range of between 10 degrees and 30 degrees. The etching process 52 is carried out in such a way that the predetermined angles W of inclination are established. The process parameters of the etching process are chosen correspondingly for this purpose, in particular the plasma power, additional gases and the gas flows. Through the choice of process parameters, polymers deposit on the sidewall during the etching process, which polymers minimally reduce the cross section. The equilibrium that forms between sidewall deposition and etching advance into the depth ensures the angle of inclination. Said polymers are stripped away without any residues in the contact hole during the resist removal.

The etching process 52 is carried out with a high selectivity with respect to silicon nitride as far as the hard mask layer 36. The hard mask layer 36 is then etched through for example in time-controlled fashion by a second etching process, which is not illustrated in the figures, however.

Figure 2:
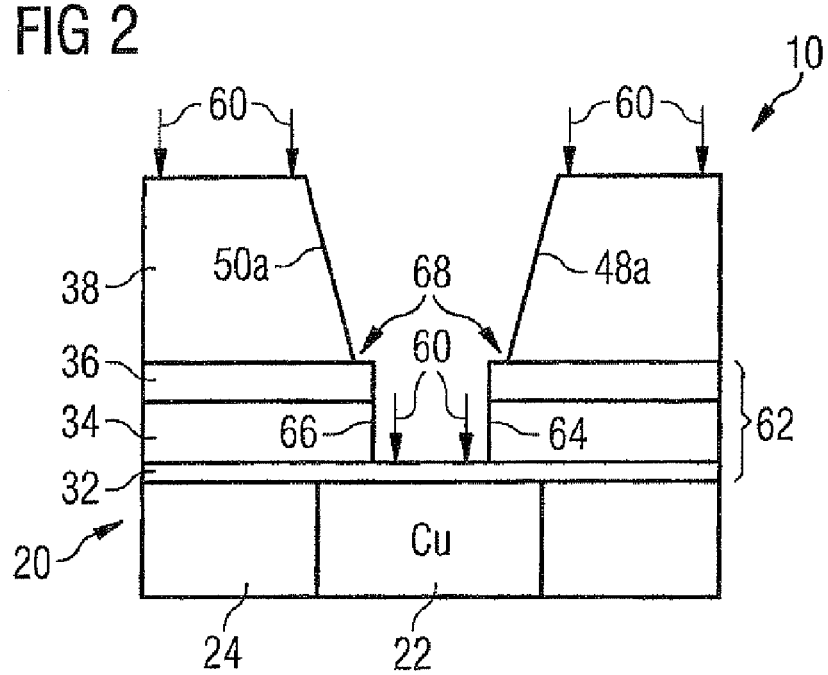

As illustrated in FIG. 2, the residues of the resist layer 40 are then removed. A cutout 62 for the lower section of the via to be produced is produced by a third etching process 60. The third etching process 60 is highly anisotropic, i.e. directional, with the result that vertical sidewalls 64 and 66 are produced in the cutout 62 for the lower section of the via to be produced. The hard mask layer 36 serves as a mask during the third etching process 60. The dielectric layer 38 is vertically thinned when the etching process 60 is carried out. Moreover, the cutout 46 is laterally expanded, thus giving rise to sidewalls 48a and 50a which, however, have the same angle W of inclination as the sidewalls 48 and 50, respectively. Partial regions 68 of the hard mask layer 36 are uncovered at the bottom of the cutout 46. The second etching process 60 is likewise carried out with a high selectivity with respect to silicon nitride until the barrier layer 32 is reached. The barrier layer 32 is subsequently etched through for example in a time-controlled manner in a fourth etching process 70 until the copper of the interconnect 22 is uncovered, see FIG. 3. The dielectric layer 38 is thinned further in the course of carrying out the etching process 70 for the perforation of the barrier layer 32. Moreover, the cutout 46 is also expanded further, thus giving rise to sidewalls 48b and 50b which, however, have the same angle W of inclination as the sidewalls 48 and 50, respectively. A process 74 arises in the hard mask layer 36 on account of the etching process 70.

Figure 3:
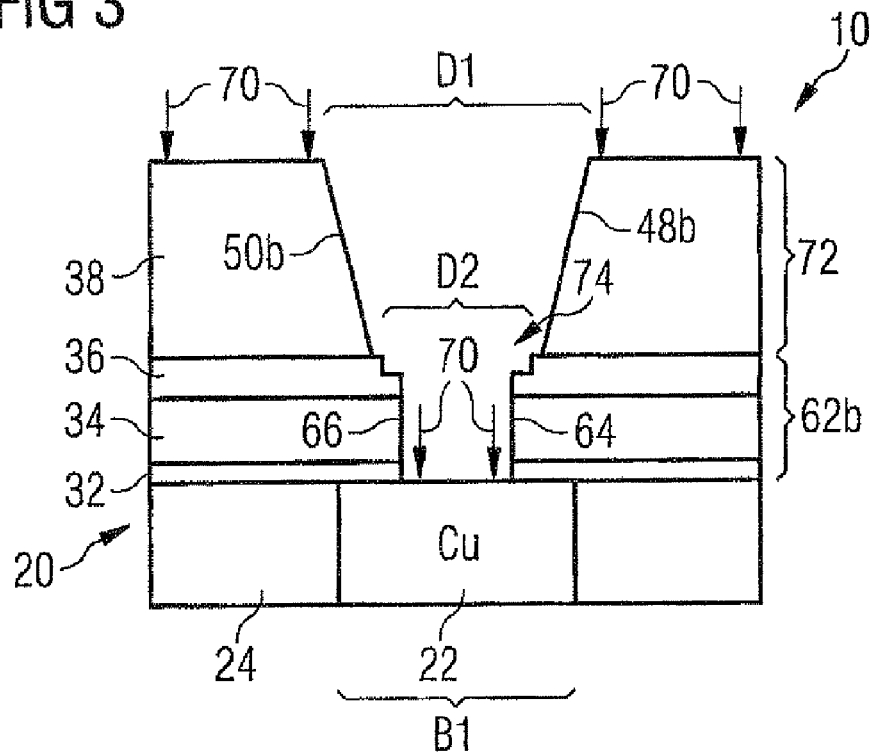

As is further illustrated in FIG. 3, a funnel-shaped cutout has been produced for the via to be produced. A cutout 72 for the upper via section has a diameter D1 at its upper opening, said diameter being considerably greater than a diameter D2 of the cutout for the lower section 62b of the via to be produced. By way of example, the diameter D1 is at least twice as large as the diameter D2. A width B1 of the interconnect 22 is less than one micrometer in the exemplary embodiment.

Figure 4:
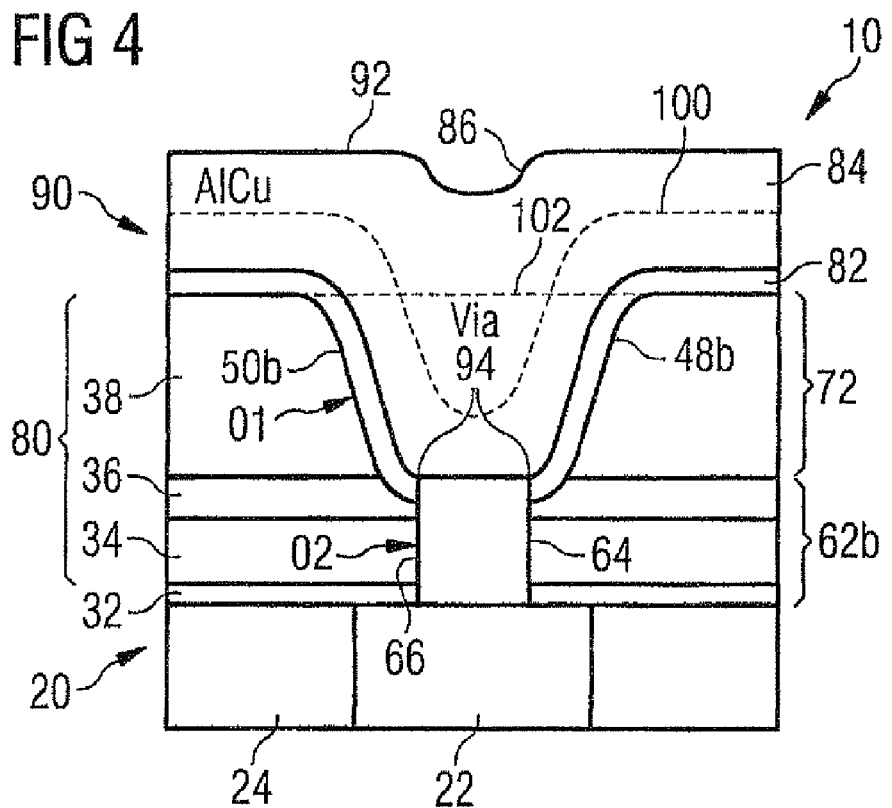

As is illustrated in FIG. 4, afterward, on account of the funnel shape of the cutouts produced, after a cleaning of the via hole, firstly a "hot" deposition process is carried out, in which the lower section 62b is completely filled. A thin metal layer deposits on the rest of the surface of the circuit arrangement 10. In the exemplary embodiment, the diameter D2 is less than 0.5 μm. A lower aluminum layer 82 is deposited, for example with the aid of a sputtering method. The thickness of the lower aluminum layer 82 is 200 nm, for example, and in one embodiment lies in a range of less than 1 μm. An aluminum-copper alloy is used in the exemplary embodiment, the proportion of copper being less than two atomic percent. The deposition temperature lies for example within the range of from 400 degrees Celsius up to 440 degrees Celsius, in order to ensure that the lower section of the via 80 is completely filled. This process section utilizes the advantages of the via section with vertical sidewalls, i.e. the defined contact area, the void-free filling on a small contact area and the small aspect ratio, which, in particular is less than 1, with the result that the lower section 62b is greater in width than in height.

Afterward, the cutout 72 for the upper section of the via 80 to be produced is completely or partly filled by a "cold" deposition process, the alloy in one embodiment projecting beyond the via 80, in one embodiment by at least 500 nanometers. The same aluminum-copper alloy as before is used. However, the deposition temperature is at least 50 degrees Celsius lower and in one embodiment lies within the range of 340 degrees Celsius to 360 degrees Celsius, and in particular is 350 degrees Celsius. In one configuration, the wafer carrying the integrated circuit arrangement 10 is actively precooled to the low temperature in order to reduce the fabrication time. The wafer is not taken from the sputtering installation between the two process sections. The thickness of the upper aluminum layer 84 is, for example, more than two micrometers, but is usually less than 5 micrometers.

The lower aluminum layer 82 and the upper aluminum layer 84 are subsequently patterned with the aid of a further photolithographic process and an etching process, an interconnect 92 being produced. The interconnect 92 leads for example to a connection pad of the integrated circuit arrangement. The connection pad serves for example for producing a bonding connection or for producing a flip-chip connection.

An edge 94 lies at the location at which the greatly inclined sidewalls 48b, 50b meet the vertical sidewalls 64 and 66. The edge 94 forms a closed circular circulation. On account of the low deposition temperature of the upper aluminum layer 84, the edge 94 is imaged conformally despite the comparatively large thickness of the aluminum layer 84, see edge 86.

FIG. 4 additionally illustrates a location O1 lying in the center of the greatly inclined sidewall 50b. A location O2 lies in the center of the vertical sidewall 66. At the location O1, the dielectric layer 38 adjoins the via 80. At the location O2, by contrast, the dielectric layer 34 adjoins the via 80.

In another embodiment, the upper aluminum layer 84 is deposited with a smaller layer thickness than in the first embodiment, see dashed line 100. In this case, the cutout 72 for the upper section of the via 80 is only partly filled. A dashed line 102 illustrates the upper boundary of the via 80. The position of the upper boundary of the via 80 matches the position of that side of the interconnect 92 which faces the component level 12.

To summarize, it holds true that, by the sequence including "hot" and "cold" contact or via hole filling, it is possible to fulfill boundary conditions which exist with regard to the flank angle, with regard to the metal granulation and with regard to the layer thickness. The double profile of the contact hole or via hole that is required for such a method implementation, i.e. steep flanks for the hot deposition and comparatively flat flanks for the cold deposition, can be obtained without additional processes with regard to a lithography or a change of installation by the use of an additional liner or an additional hard mask 36. The additional hard mask layer 36 requires only a further deposition which is carried out without expense and in the same installation, but in a different chamber, or even in the same chamber with altered process gases.

The dielectric layer 34 arranged under the hard mask layer can be deposited with a precisely predetermined layer thickness, the layer thickness tolerance being less than ±3 percent, for example. The layer thickness of the dielectric layer 34 defines the vertical position or length of the lower section of the via 90 and thus indirectly also the position or length of the upper section of the via 90. Consequently, it is possible to fulfill narrow predetermined tolerances imposed on the process, in particular at different locations of an integrated circuit arrangement, at different locations of a wafer and also at circuit arrangements which have been produced on different wafers.

The boundary conditions just discussed concern:

the flank angle: the lower via section has to be produced by a "hot" deposition process, wherein in the case of aluminum typical values lie between 400 degrees Celsius and 450 degrees Celsius. The following generally holds true: the steeper the flanks of the contact or via holes, the higher the temperature of the metal deposition is to be set. By way of example, an angle W of the contact or via hole flanks of less than or equal to 2 degrees necessitates a temperature of 440 degrees Celsius for the metal deposition in order to effect vacancy-free or void-free filling. The aim is contact hole sidewalls that are as steep as possible, in order to keep the area requirement small, that is to say that high deposition temperatures are required.

Metal granulation: as the temperature of the metal deposition rises, the granularity increases, which leads to an undesirable rough surface of the metal track. This leads, for its part, to a number of technical problems in the process implementation. By way of example, the grain structures overlap optical alignment marks, the usability of which is thereby restricted. Resist residues on the aluminum layer also can no longer be completely removed. During the subsequent etching, said resist residues then have a masking effect or may lead to the destruction of metal tracks in the next thermal process as a result of uncontrolled volume increases. The aim is to keep the temperature of the material deposition low with regard to the material granulation.

Layer thickness: a further requirement is to achieve a lowest possible sheet resistance of the topmost metal plane, for example for radiofrequency applications as coil plane. Typical values for the thickness of the metal are 3 micrometers to 5 micrometers. The granulation of the aluminum increases greatly as the layer thickness increases. For a thickness of 3 micrometers, for example, the deposition temperature must not exceed 330 degrees Celsius.

By using the methods specified above, the upper metallization plane can be produced by using a process in which the vias are filled simultaneously with the deposition of interconnect material, with the result that via and interconnect include the same material. After the opening of the via hole, the material deposition for the topmost metallization plane is utilized for filling said holes.

By using the lower via section with vertical sidewalls, it is possible to use a small contact area D2, which is also associated with critical aspect ratios. A small pitch of the lower metal plane, of 280 nm for example, can be fabricated. The liner formed as a hard mask reliably defines the contact area. Since, with the thickness of the aluminum metal, the design rules thereof in the wiring plane are significantly more relaxed, the diameter of the upper opening D1 is noncritical and, consequently, does not restrict the minimum pitch of the upper metallization plane.

To summarize further it holds true that an additional liner with the function of a hard mask is integrated. A combined contact or via hole is specified which has flank angles that can be set in a defined manner. Furthermore, a "hot" filling method is combined with a "cold" filling method for the filling of a via hole. The following advantages can thereby be achieved:

more precise definition of the contact area D2, FIG. 3, more relaxed design rules, e.g., with regard to the overlapping, in the copper plane, higher packing density of the wiring tracks in the copper plane, provision of higher metal thicknesses with reduced rework rates, where the "rework" relates to the repetition of the deposition, exposure and development of a resist. This becomes necessary if the mask was misaligned during the exposure, for example owing to poor alignment marks, relaxed aspect ratios of the lower section of the via.

The methods specified can be applied for all metallizations. By way of example, in an aluminum-based BEOL (back end of line), the topmost wiring plane is connected to the underlying wiring plane by the vias according to the invention, in order to replace tungsten-filled vias. In a copper BEOL, the last copper plane is connected with an aluminum plane which is itself a wiring plane. The aluminum plane is electrically connected to the underlying copper plane by the vias according to the invention. The abovementioned advantages are afforded in both cases. The methods are used in particular in technologies with a minimum critical feature size of 250 nm (nanometers), 110 nm, 90 nm or less than 90 nm. The applications relate for example to dynamic memories (DRAM), so-called NROM (nitride read only memory) or technologies for logic chips.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit arrangement comprising:

producing a first conductive structure;

depositing at least one first dielectric layer after the production of the first conductive structure;

depositing at least one hard mask layer after the deposition of the first dielectric layer;

depositing at least one further dielectric layer after the deposition of the hard mask layer;

patterning the further dielectric layer and of the hard mask layer by means of a photolithographic method in a first etching process with the production of a cutout in the further dielectric layer;

patterning the first dielectric layer with the aid of the patterned hard mask layer in a second etching process, which differs from the first etching process, with the production of a cutout in the first dielectric layer;

depositing a first metal layer at a first deposition temperature with the filling of the cutout in the first dielectric layer;

after the deposition of the first metal layer, depositing a second metal layer at a second deposition temperature, which is lower than the first deposition temperature; and actively precooling the integrated circuit arrangement to the second deposition temperature prior to depositing the second metal layer.

2. The method of claim 1, comprising:

patterning the second metal layer and of the first metal layer by means of a further photolithographic method with the production of a second conductive structure.

3. The method of claim 1, comprising:

producing the cutout in the further dielectric layer by means of an etching process in which inclined sidewalls arise, wherein the angle of inclination of the sidewalls relative to the direction of the normal to a component level of the integrated circuit arrangement lies within the range of 5 degrees to 35 degrees, or within the range of 10 degrees to 25 degrees; and producing the cutout in the first dielectric layer by means of an anisotropic etching process, wherein side walls have an angle of inclination of less than 85 degrees.

4. The method of claim 1, comprising producing the first conductive structure using a damascene method.

5. A method for producing an integrated circuit comprising:

fabricating an interconnect level comprising an interconnect;

depositing a barrier layer over the interconnect level;

depositing a first dielectric layer over the barrier layer;

depositing a hard mask layer over the first dielectric layer;

depositing a second dielectric layer over the hard mask layer;

patterning the second dielectric layer using a photolithographic method in a first etching process to expose a portion of the hard mask layer;

etching the exposed portion of the hard mask layer in a second etching process to expose a portion of the first dielectric layer;

etching the exposed portion of the first dielectric layer based on the etched hard mask layer in a third etching process to expose the barrier layer and to provide a cutout in the first dielectric layer;

etching the exposed portion of the barrier layer in a fourth etching process to expose the interconnect;

depositing a first metal layer at a first deposition temperature over the exposed portions of the interconnect, the barrier layer, the first dielectric layer, the hard mask layer, and the second dielectric layer filling the cutout in the first dielectric layer;

depositing a second metal layer over the first metal layer at a second deposition temperature that is lower than the first deposition temperature; and actively precooling the integrated circuit to the second deposition temperature prior to depositing the second metal layer.

6. The method of claim 5, further comprising:

patterning the second metal layer and the first metal layer using a photolithographic method to provide a via.

7. The method of claim 5, wherein the interconnect contains at least 80 atomic percent of copper; and wherein the first metal layer and the second metal layer contain at least 80 atomic percent of aluminum.

8. The method of claim 5, wherein patterning the second dielectric layer using a photolithographic method in a first etching process comprising using a first etching process in which inclined sidewalls arise, wherein the angle of inclination of the sidewalls relative to the direction of the normal to a component level of the integrated circuit lies within the range of 5 degrees to 35 degrees; and wherein etching the exposed portion of the first dielectric layer comprises using an anisotropic etching process such that sidewalls of the etched first dielectric layer have an angle of inclination of less than 85 degrees.

9. The method of claim 5, wherein fabricating the interconnect level comprising the interconnect comprises fabricating the interconnect using a damascene method.

10. The method of claim 5, wherein the barrier layer comprises silicon nitride, wherein the first dielectric layer comprises silicon dioxide, wherein the hard mask layer comprises silicon nitride, and wherein the second dielectric layer comprises silicon dioxide.

11. The method of claim 5, wherein depositing the barrier layer comprises depositing the barrier layer to a first thickness, and wherein depositing the first dielectric layer comprises depositing the first dielectric layer to a second thickness greater than the first thickness.

12. The method of claim 11, wherein depositing the hard mask layer comprises depositing the hard mask layer to a third thickness less than the second thickness.

13. The method of claim 12, wherein depositing the second dielectric layer comprises depositing the second dielectric layer to a fourth thickness greater than the third thickness.

14. The method of claim 12, wherein depositing the second dielectric layer comprises depositing the second dielectric layer to a fourth thickness greater than two times the second thickness.

\* \* \* \* \*